(12) United States Patent
Duclos et al.

(10) Patent No.: US 6,369,640 B1
(45) Date of Patent: Apr. 9, 2002

(54) ZERO CROSSING CONTROL STRUCTURE FOR A BIDIRECTIONAL SWITCH WITH A STABLE THRESHOLD

(75) Inventors: Franck Duclos, Tours; Olivier Ladiray, Montlouis sur Loire; Jean-Michel Simonnet, Veretz, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/628,199

(22) Filed: Jul. 28, 2000

(30) Foreign Application Priority Data

Jul. 28, 1999 (FR) .............................. 99 09986

(51) Int. Cl.[7] ....................... H03K 17/13; H03K 17/72
(52) U.S. Cl. ..................... 327/451; 327/452; 327/502
(58) Field of Search ......................... 327/78, 79, 421, 327/438, 440, 445, 446, 451, 452, 455, 459, 469–476, 502, 580, 584

(56) References Cited

U.S. PATENT DOCUMENTS

| | | | |
|---|---|---|---|
| 3,743,860 A | 7/1973 | Rossell | 307/252 |
| 3,883,782 A | 5/1975 | Beckwith | 317/16 |
| 3,902,080 A | * 8/1975 | St. Clair et al. | 327/452 |
| 4,051,394 A | 9/1977 | Tieden | 307/310 |
| 4,535,251 A | 8/1985 | Herman et al. | 250/551 |
| 4,876,498 A | * 10/1989 | Luchaco et al. | 327/452 |
| 5,668,496 A | * 9/1997 | Rebordosa | 327/457 |
| 5,686,857 A | * 11/1997 | Heminger et al. | 327/451 |
| 5,838,555 A | 11/1998 | Lejeune et al. | 363/49 |
| 5,914,628 A | 6/1999 | Rault | 327/452 |

FOREIGN PATENT DOCUMENTS

DE 25 59 564 A 5/1977 ........... H05B/37/02

OTHER PUBLICATIONS

French Search Report from French Patent Application 99 09986, filed Jul. 28, 1999.

* cited by examiner

Primary Examiner—My-Trang Nuton
(74) Attorney, Agent, or Firm—Wolf, Greenfield & Sacks, P.C.; James H. Morris

(57) ABSTRACT

A zero crossing control circuit of a bidirectional switch including two transistors of complementary types connected in parallel between the gate of the bidirectional switch and the main reference terminal of the bidirectional switch, the gate of the bidirectional switch being connected to a control source via a first resistor, and each of the control terminals of the transistors being connected to the second main terminal of the bidirectional switch via a second resistor of high value, a zener diode being interposed between the second resistor and each of the control terminals according to a biasing adapted to turning on each of the transistors when the zener threshold is exceeded.

18 Claims, 4 Drawing Sheets

ZERO CROSSING CONTROL STRUCTURE FOR A BIDIRECTIONAL SWITCH WITH A STABLE THRESHOLD

BACKGROUND OF THE INVENTION

1. Field of the Invention

The present invention relates to the control of bidirectional switches of medium power, such as, for example, triacs.

2. Discussion of the Related Art

A bidirectional switch includes two main terminals A1 and A2 and a gate G. A bidirectional switch capable of switching on when a positive or negative voltage exists between terminals A1 and A2 and a current pulse—negative or positive—is made to flow between the control terminal and terminal A1 that will be called the reference terminal. The bidirectional switch then remains conductive until the current flowing therethrough crosses zero.

In many cases, it is desired to only allow a bidirectional switch to turn on when the voltage across its main terminals is close to zero. This type of control is called a zero crossing control circuit although, in fact, it occurs when the voltage across the bidirectional switch is sufficient to enable its turning on, for example about ten volts.

Several known circuits implement this function. FIG. 1 illustrates such a zero crossing control circuit described in European patent application No. 0837545 which is incorporated herein by reference. A bidirectional switch TR is connected by a main terminal A2 to a load L, the series connection of load L with bidirectional switch TR being connected across A.C. voltage terminals I1, I2, for example, the mains. Terminal I1 is at a reference potential, for example the ground, and is connected to main terminal A1, that is, the reference terminal of the bidirectional switch.

Two complementary transistors are connected between gate G and reference terminal A1 of bidirectional switch TR. These complementary transistors are an NPN-type bipolar transistor Q1 and a PNP-type bipolar transistor Q2. The emitter of transistor Q1 and the collector of transistor Q2 are connected to gate G. The collector of transistor Q1 and the emitter of transistor Q2 are connected to terminal A1 of bidirectional switch TR. The bases of transistors Q1 and Q2 are connected to each other and to terminal A2 via a resistor of high value R1. The control order is applied between terminals I3 and I4. Terminal I4 is connected to terminal I1 and forms a reference terminal. Terminal I3 is connected to gate G via a resistor R2. The control order is a signal having a 0-volt value (the potential of terminals I1 and I4) when the bidirectional switch is not desired to turn on and a negative value, for example −5 volts, when the bidirectional is desired to be turned on.

The circuit operates as follows.

When the voltage on terminal I2 is high, one of transistors Q1 or Q2 is controlled to be turned on. Terminals G and A1 are then short-circuited by one of the transistors and no control current can flow between terminals G and A1. Bidirectional switch TR is thus off.

When the voltage on terminal I2 is smaller than a given threshold, both transistors Q1 and Q2 are off and, if the voltage on control terminal I3 is negative, a current will flow from terminal A1 to terminal G and will turn bidirectional switch TR on. Thus, the application of a control order (negative voltage) on terminal I3 can be considered to be delayed until the voltage on terminal A2 has fallen to a low value with respect to the voltage on terminal A1.

Then, bidirectional switch TR will turn off each time the voltage thereacross falls and becomes close to a zero value. The bidirectional switch will then be turned on again at the beginning of the next (positive or negative) halfwave if the control order is still present.

A disadvantage of this type of circuit is the fact that its positive and negative switching thresholds, that is, the voltage difference across transistors Q1 and Q2 beyond which one of them is off, are not precisely known. Indeed, these thresholds, on the order of a few volts, typically approximately 10 volts, depend in particular on the value of resistor R1 and on the gain of the transistors. Now, on the one hand, it is relatively complex to obtain complementary transistors Q1 and Q2 with identical gains. On the other hand, the gains of each of the transistors will vary during their lifetime, especially according to temperature. A dispersion of the value of the maximum positive and negative voltages beyond which the bidirectional switch is inhibited can thus be experimentally observed.

SUMMARY OF THE INVENTION

An object of the present invention is to provide a novel monolithic structure of a zero crossing control circuit for a bidirectional switch that enables stabilizing the value of the voltage beyond which the bidirectional switch is inhibited.

Another object of the present invention is to provide such a monolithic structure in which the positive and negative inhibition thresholds are identical.

Another object of the present invention is to provide monolithic embodiments of such control circuits.

To achieve these and other objects, the present invention provides a monolithic implementation of a zero crossing control circuit of a bidirectional switch including two transistors of complementary types connected in parallel between the gate of the bidirectional switch and the main reference terminal of the bidirectional switch, the gate of the bidirectional switch being connected to a control source via a first resistor, and each of the control terminals of the transistors being connected to the second main terminal of the bidirectional switch via a second resistor of high value, a zener diode being interposed between the second resistor and each of the control terminals according to a biasing adapted to turning on each of the transistors when the zener threshold is exceeded. According to the present invention, the circuit is formed in the same semiconductor substrate of a first conductivity type as the bidirectional switch.

According to an embodiment of the present invention, the control terminals of the transistors are interconnected and the zener diodes are series connected, anode to anode, between the second resistor and the interconnection node of the control terminals.

According to an embodiment of the present invention, the second resistor is formed in the same first portion of the substrate as the bidirectional switch.

According to an embodiment of the present invention, the zener diodes are formed on the front surface side of the substrate in a layer of the second conductivity type, including, on the front surface side, two regions of the first conductivity type contacted by metallizations, and a region being formed, by deep diffusion from the front surface, under and in contact with the layer.

According to an embodiment of the present invention, a first zener diode is formed in the same portion of the substrate as one of the complementary transistors.

According to an embodiment of the present invention, a second zener diode is formed in a portion of the substrate distinct from a portion where the second transistor is formed.

According to an embodiment of the present invention, a second zener diode is formed in a same portion of the substrate as the second transistor.

According to an embodiment of the present invention, the two complementary transistors are of bipolar type.

According to an embodiment of the present invention, the two complementary transistors are of MOS type.

The foregoing objects, features and advantages of the present invention, will be discussed in detail in the following non-limiting description of specific embodiments in connection with the accompanying drawings.

DETAILED DESCRIPTION

Figure 3:
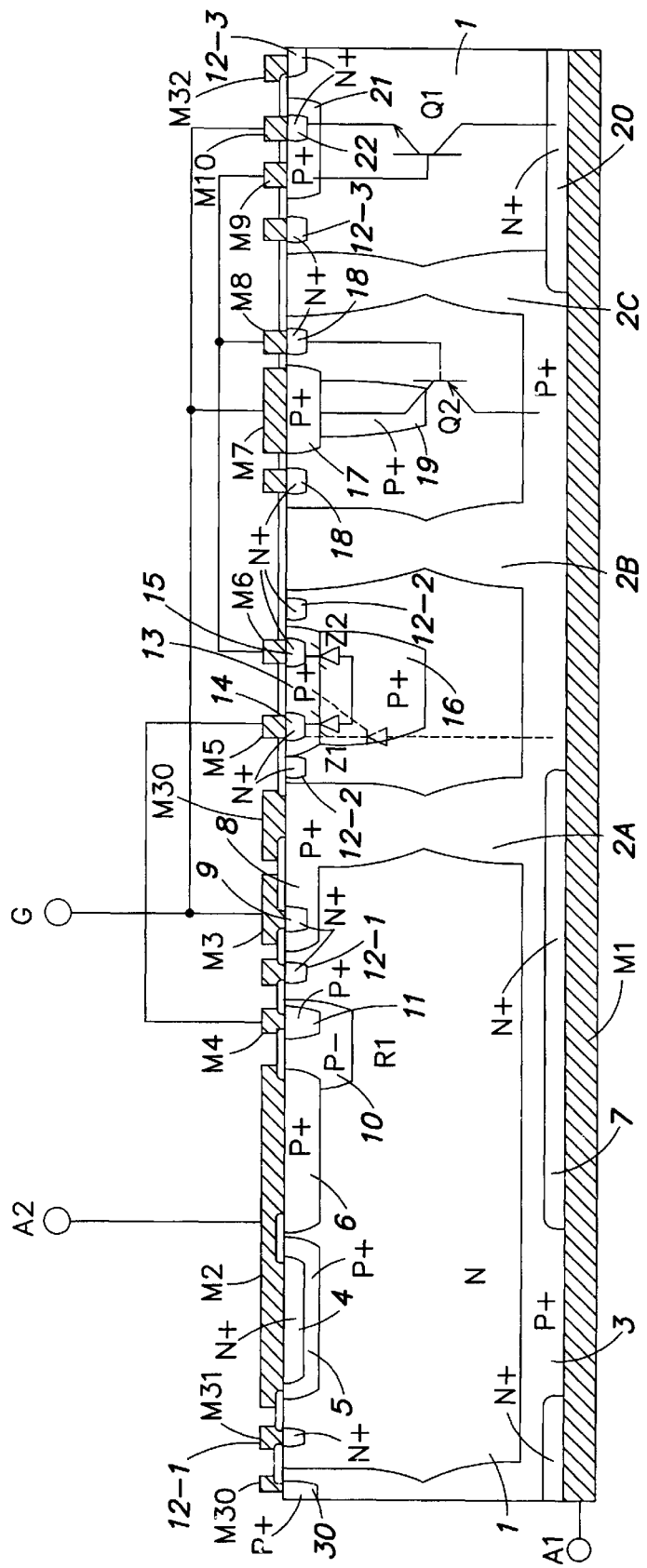
FIG. 3 illustrates an embodiment in monolithic form of the control circuit of FIG. 2.
Figure 5:
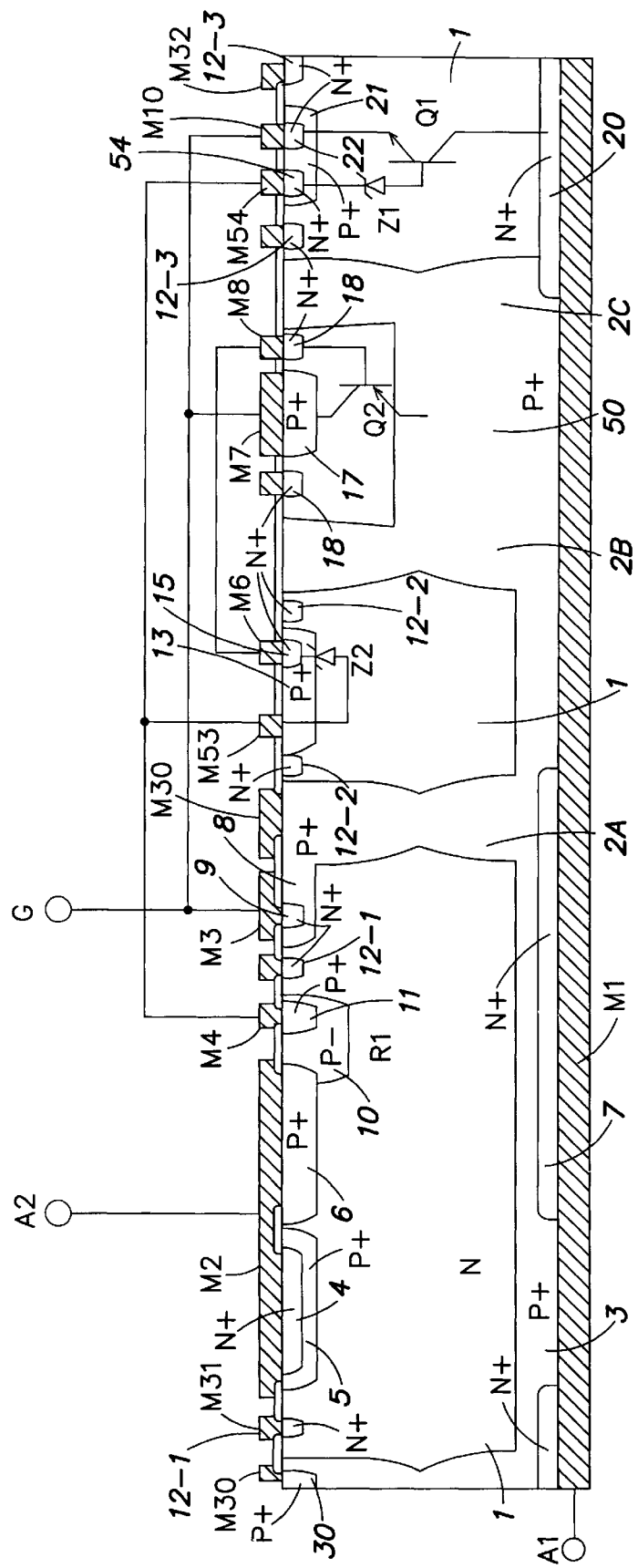
FIGS. 5 and 6 illustrate alternative embodiments in monolithic form of the control circuit of FIG. 4.
Figure 6:
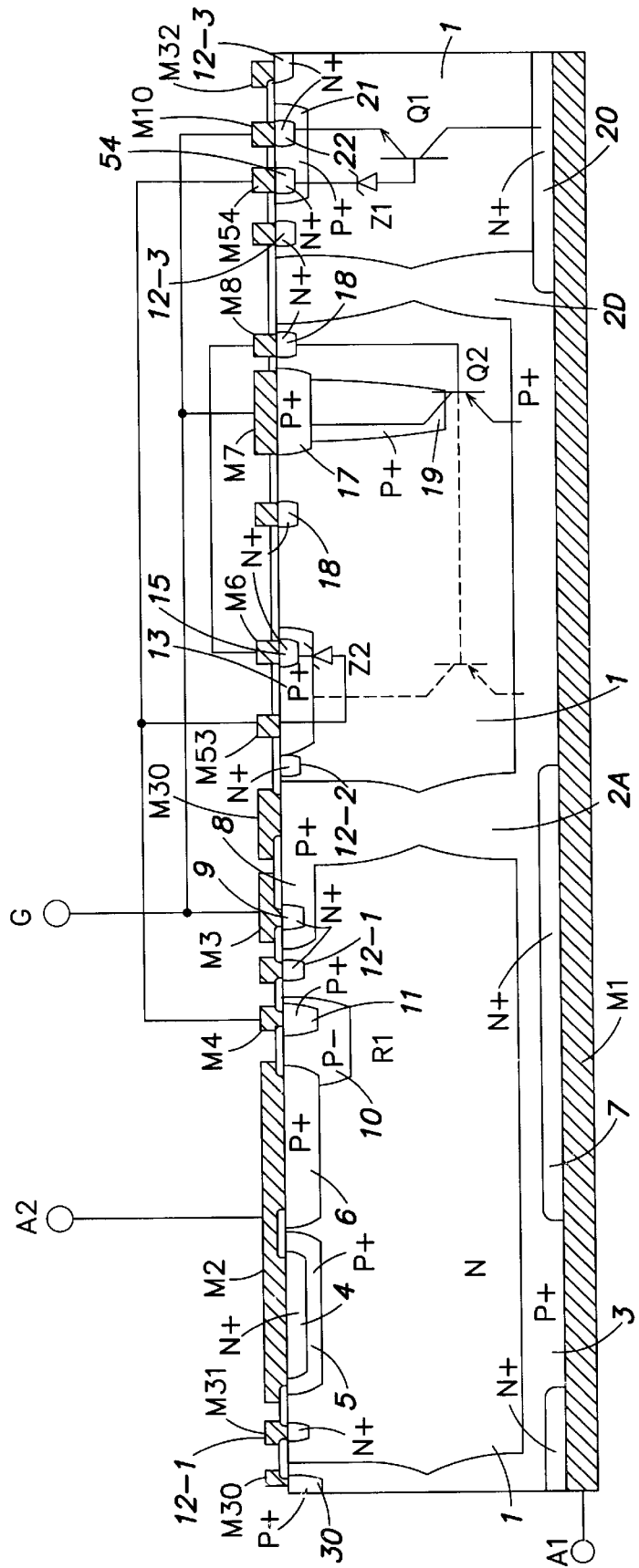

For clarity, the same elements have been designated by same references in the different drawings and, further, as usual in the representation of integrated circuits, FIGS. 3, 5 and 6 are not drawn to scale.

Figure 1:
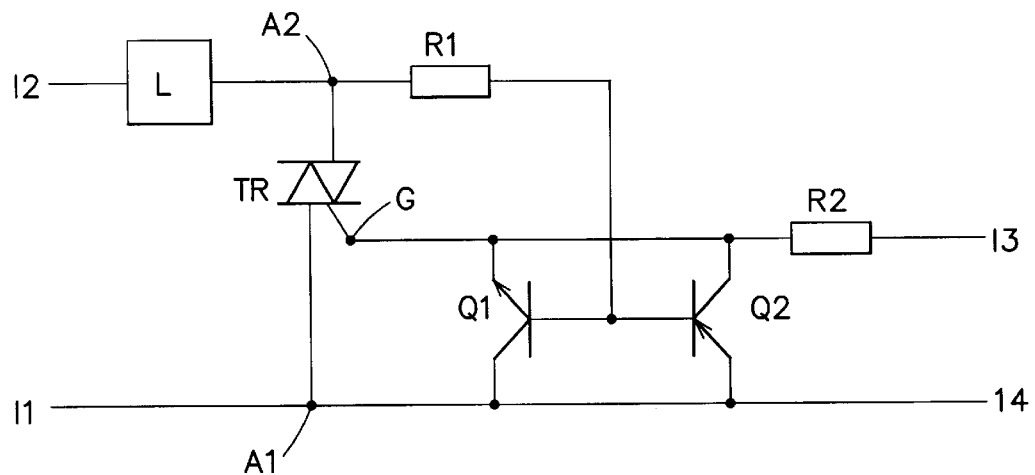
FIG. 1 shows an example of a zero crossing control circuit of a bidirectional switch.
Figure 2:
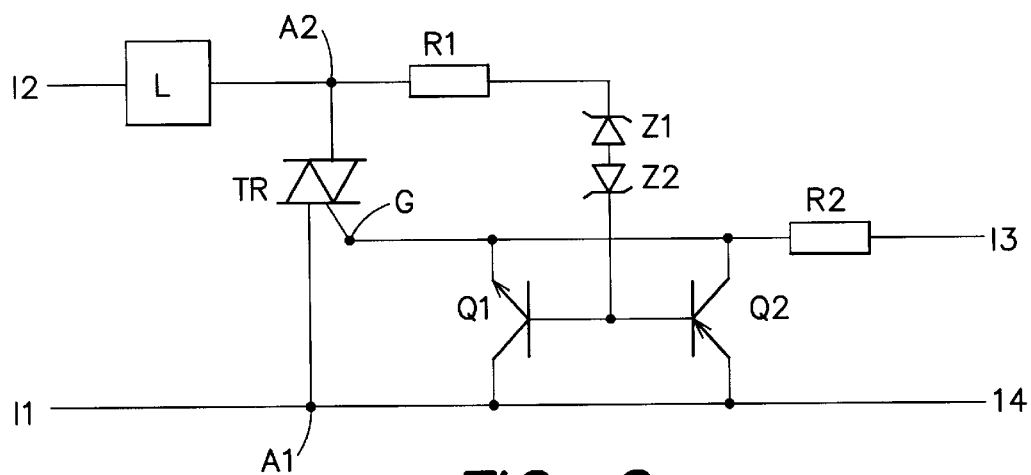
FIG. 2 shows another example of a zero crossing control circuit of a bidirectional switch according to the present invention.

FIG. 2 shows a first example of a zero crossing control circuit for a bidirectional switch, that is implemented in monolithic form according to the present invention. The circuit is identical to that in FIG. 1, except that two zener diodes Z1 and Z2 are interconnected in series, head-to-tail (anode to anode), between resistor R1 and the interconnected bases of transistors Q1 and Q2.

The operation of this circuit is similar to that of the circuit of FIG. 1. However, due to the presence of zener diodes Z1 and Z2, the switching threshold is stabilized.

Indeed, the flowing of a base current is made impossible as long as the voltage on terminal I2 is smaller than a given fixed threshold that only depends on the fixed value of resistor R1 and on the threshold determined by the zener diodes. By setting this threshold to an appropriate value, for example on the order of 10 volts, the disadvantages of the prior circuit are eliminated.

FIG. 3 shows an exemplary monolithic implementation according to the invention of the zero crossing control circuit of FIG. 2. For clarity, the symbols of some components, that is, transistors Q1 and Q2 and zener diodes Z1 and Z2, have been shown in FIG. 3.

The structure of FIG. 3 is formed from a semiconductor substrate 1 of a first conductivity type, for example, a lightly-doped N-type substrate.

Substrate 1 is divided from left to right into four distinct portions separated by P-type isolating walls 2A, 2B, 2C. Conventionally, walls 2A, 2B, and 2C are obtained by deep diffusions from the two substrate surfaces.

The rear surface of substrate 1 is coated with a metallization M1 corresponding to reference terminal A1 of bidirectional switch TR, connected to reference supply terminal I1.

In the first portion, to the left of the substrate, are located bidirectional switch TR and resistor R1. Bidirectional switch TR is formed of two thyristors in antiparallel between terminals A1 and A2. The anode of a first thyristor corresponds to a P-type layer 3 on the rear surface side of substrate 1. The cathode of this first thyristor corresponds to an N-type region 4 formed on the front surface side in a P-type layer 5. The anode of the second thyristor of the bidirectional switch corresponds to a P-type layer 6 formed on the front surface side. Its cathode corresponds to an N-type region 7 formed in layer 3, on the rear surface side.

Layer 3 is formed on the rear surface side to be present in the first three portions of the substrate.

The upper surfaces of regions 4 and 6 are coated with a metallization M2 corresponding to terminal A2 of the bidirectional switch.

An N-type layer 9 has also been formed on the front surface side in a P-type layer 8. Layer 8 is in contact with isolating wall 2A. Region 9 is contacted with a metallization M3 and forms gate G of the bidirectional switch.

Resistor R1 is formed of a P-type region 10, formed on the front surface side in contact with region 6. Region 10 is more lightly doped than layer 6 and has a greater diffusion depth. Region 10 includes at its surface, on the front surface side, a heavily-doped region 11 of same type P, contacted by a metallization M4.

The first portion of substrate 1 also includes, on the front surface side, N-type channel stop regions 12-1 between each of regions 5 and 10 on the one hand and isolating wall 2A on the other hand.

In the second portion of substrate 1, to the right of the first portion, are located zener diodes Z1 and Z2. Their common anode corresponds to a P-type layer 13, formed on the front surface side. Their respective cathodes correspond to N-type regions 14, 15 formed in layer 13. Each of regions 14 and 15 is contacted by a respective metallization M5 and M6. Cathode metallization M5 of diode Z1 is connected to metallization M4, that is, to resistor R1. Metallization M6 is connected to the bases of transistors Q1 and Q2 in the way described hereafter. N-type channel stop regions 12-2 are provided on the front surface side of substrate 1 between layer 13 and isolating wall 2B. A region 16 is also provided under P-type layer 13. Region 16, obtained for example by a deep diffusion from the front surface upon diffusion of the isolating walls, is intended for avoiding the forming of a parasitic transistor, shown in dotted lines in FIG. 3, between one of regions 14, 15 and layer 3.

In the third portion of the substrate, defined by isolating wall 2C, PNP transistor Q2 is formed. The emitter of transistor Q2 corresponds to layer 3, its base being formed by substrate 1. The collector of transistor Q2 is formed of a P-type layer 17 formed on the front surface side and is contacted by a metallization M7 connected to metallization M3 of gate G of bidirectional switch TR. A heavily-doped N-type region 18 is formed down to a small depth, on the front surface side, around layer 17, and is coated with a base metallization M8 connected to cathode metallization M6 of diode Z2. To maximize the gain of PNP transistor Q2, so that it be close to that of NPN transistor Q1, the structure of FIG. 3 also includes, under layer 17, a P-type region 19. Region 19, obtained by deep diffusion from the front surface, enables locally reducing the thickness of substrate 1. This enables reducing or minimizing the thickness of the base of transistor Q2. Then, the gain of this transistor, which is proportional to the inverse of the base depth, is increased or maximized.

In the fourth portion of substrate 1, to the right of FIG. 3, NPN transistor Q1 is formed. The collector of transistor Q1 corresponds to an N-type region 20 formed on the rear surface side of substrate 1. Its base corresponds to a P-type layer 21 formed on the front surface side and contacted by a metallization M9. The emitter of transistor Q1 corresponds to an N-type region 22 formed in layer 21. Region 22 is contacted by a metallization M10. Metallization M9 (the base of transistor Q1) is connected to metallization M8 (the base of transistor Q2) and to metallization M6 (the cathode of diode Z2). Metallization M10 (the emitter of transistor Q1) is connected to metallization M3 (gate G of the bidirectional switch). An N-type channel stop region 12-3 may also be provided in this fourth portion of the substrate, around layer 21, on the front surface side.

According to an embodiment, isolating wall 2A is contacted by a metallization M30, at least partially via a heavily-doped P-type region 30. Channel stop regions 12-1 and 12-3 may also be contacted by metallizations M31 and M32.

Figure 4:
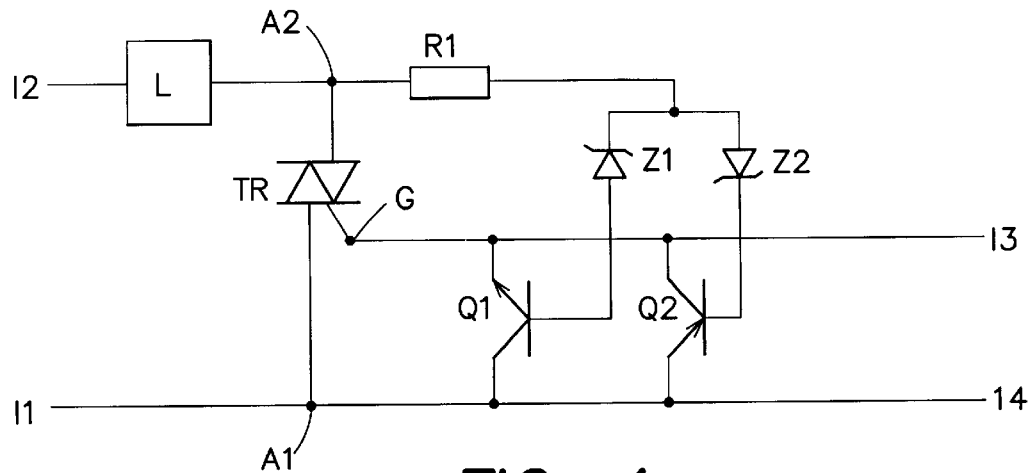
FIG. 4 shows a further example of a zero crossing control circuit of a bidirectional switch according to the present invention.

FIG. 4 illustrates a second example of zero crossing control circuit that is implemented in monolithic form according to the present invention. FIGS. 2 and 4 are similar. However, the bases of transistors Q1 and Q2 are now distinct and respectively connected to the anode of diode Z1 and to the cathode of diode Z2, the cathode of diode Z1 and the anode of diode Z2 being interconnected to resistor R1.

The operation of the control circuit of FIG. 4 is similar to that of FIG. 2. Only when the voltage on terminal I2 is smaller than the threshold determined by the value of resistor R1 and the threshold of one or the other of diodes Z1 and Z2, which can be on the order of 10 volts, are the two transistors Q1 and Q2 off and do they enable transmission of a control signal to gate G of bidirectional switch TR.

FIG. 5 illustrates a first embodiment in monolithic form according to the invention of the zero crossing control circuit of FIG. 4.

According to this embodiment, from the left to the right of the drawing, bidirectional switch TR and resistor R1 are formed in a first portion of the substrate, diode Z2 is formed in a second portion, transistor Q2 is formed in a third portion, and transistor Q1 and diode Z1 are formed in a fourth portion.

Bidirectional switch TR and resistor R1 are formed in the same way as in FIG. 3.

The second portion of substrate 1 contains zener diode Z2. In P-type layer 13 is only formed N-type region 15 corresponding to the cathode of zener diode Z2. Layer 13 is contacted by a metallization M53 connected to resistor R1 (metallization M4).

Comparatively to the embodiment of FIG. 3, the need to provide a deep diffused region 16 under layer 13 to eliminate a parasitic thyristor is advantageously eliminated.

In the third portion of the substrate, PNP transistor Q2 has been formed. In the example of FIG. 5, it has been chosen, to obtain a transistor of high gain, to form by deep diffusion from the rear surface a P-type region 50. Region 50 may be formed at the same time as isolating wall 2C. A transistor of reduced base thickness is thus obtained.

A transistor Q2 identical to that illustrated in FIG. 3 could also be used in the embodiment of FIG. 5. Conversely, a transistor Q2 identical to that of FIG. 5 could also be used in the example of FIG. 3.

In the fourth portion of the substrate, NPN transistor Q1 and diode Z1 are formed. For this purpose, in addition to region 22 corresponding to the emitter of transistor Q1, an N-type region 54 forming the cathode of diode Z1 is formed in region 21. Region 54 is contacted by a metallization M54. Metallization M54 is connected to metallization M4 (resistor R1).

The connection between gate G of bidirectional switch TR, the emitter of transistor Q1 and the collector of transistor Q2 is ensured identically to the embodiment of FIG. 3 via metallizations M3, M7 and M10.

FIG. 6 illustrates a second embodiment in monolithic form of the control circuit according to the present invention described in relation with FIG. 4.

The left-hand and right-hand portions of FIG. 6 are identical to the homologous portions of FIG. 5. The left-hand portion corresponds again to the forming of a bidirectional switch TR and of resistor R1. The right-hand portion corresponds to the forming of NPN transistor Q1 and of zener diode Z1.

FIG. 6 differs from FIG. 5 in that it now only includes three portions. The second and third portions of the substrate are gathered in a single central portion defined by an isolating wall 2D. In this central portion are formed zener diode Z2 and PNP transistor Q2. Transistor Q2 is then formed according to the embodiment described in relation with FIG. 3, that is, including a P-type deep diffusion 19 under a P-type layer 17 formed on the front surface side. Diode Z2 is formed as in FIG. 5 by a P-type layer 13, an N-type cathode region 15 and metallizations M6 and M53.

An advantage of the embodiment of FIG. 6 is to reduce the integration surface with respect to the embodiment of FIG. 5.

A criterion of choice between the embodiments of FIG. 5 and 6, besides the available integration surface, may be linked to the parasitic transistor shown in dotted lines that can appear in the case of the embodiment of FIG. 6. However, its effect is negligible. Indeed, this transistor will be activated for a negative voltage greater than the zener voltage of diode Z2. This parasitic transistor, of same type as transistor Q2, can then take a portion of the base current thereof. However, the thickness of the base of this parasitic transistor, the thickness of the substrate between layer 3 and layer 13, is much greater than that of transistor Q2, between layer 3 and deep diffusion 19. Accordingly, the gain of the parasitic transistor will be very small with respect to the gain of transistor Q2. Then, the branched current will in fact be negligible.

Of course, the present invention is likely to have various alterations, modifications, and improvements which will readily occur to those skilled in the art. In particular, the specific structure of the bidirectional switch used in the examples of embodiment in monolithic form of FIGS. 3, 5, and 6 has no limiting effect. The present invention applies to all types of realization in monolithic form of a bidirectional switch structure or of an array of bidirectional switches, provided that it is provided with a zero crossing control circuit.

In the embodiments in monolithic form (FIGS. 3, 5 and 6), layer 8 has been assumed to be in contact with isolating wall 2A by a formation in direct contact in substrate 1. However, it may be formed with no contact with isolating wall 2A, in which case an electric connection is ensured outside the substrate, via metallization M30 and a metallization contacting layer 8.

Further, the specific case where the control signal is provided in the form of a negative voltage with respect to the reference voltage has been considered in the foregoing description and transistors Q1 and Q2 have been connected accordingly. If the control order is supplied in the form of a positive pulse, the collector and emitter connections of each of transistors Q1 and Q2 should be inverted. The realization in monolithic form will then be similar to any of the previously-described realizations for a negative control. However, on the bidirectional switch side, the gate biasing must be modified. For example, considering the preceding structure, layer 8 will be formed with no contact with the neighboring isolating wall 2A, region 9 will be electrically connected to this wall and layer 8 will form gate G of switch TR. The control portion will be modified as follows. The diodes will be formed as previously. PNP transistor Q2 will be formed so that the emitter is located on the upper surface (corresponding, for example, to region 17) and the collector is located on the lower surface (corresponding, for example, to layer 3). NPN transistor Q1 is formed in lateral form, its emitter being connected to reference terminal A1/I1, its collector being connected to the control via resistor R2. The electric connections are modified appropriately.

Further, the positive pulse control and negative pulse control embodiments may be combined. The control terminals of the four transistors are then interconnected to the cathode of the same diode Z2.

It should also be noted that the transistors of complementary types may be of MOS type. Further, all conductivity types could be inverted, the biasings being then correspondingly modified.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A monolithic structure of a zero crossing control circuit of a bidirectional switch including two transistors of complementary types connected in parallel between a gate of the bidirectional switch and a main reference terminal of the bidirectional switch, the gate of the bidirectional switch being connected to a control source via a first resistor, and control terminals of the transistors being connected to a second main terminal of the bidirectional switch via a second resistor of high value, a current path of a first zener diode being interposed between the second resistor and each of the control terminals according to a biasing constructed and arranged to turn on each of the transistors when the zener threshold is exceeded, wherein the control circuit is formed in a same semiconductor substrate of a first conductivity type as the bidirectional switch.

2. The structure of claim 1, further including a second zener diode wherein the control terminals of the transistors are interconnected and the zener diodes are series connected, anode to anode, between the second resistor and the interconnection node of the control terminals.

3. The structure of claim 2, wherein the second resistor is formed in a same first portion of the substrate as the bidirectional switch.

4. The structure of claim 2, wherein the zener diodes are formed on the front surface side of the substrate in a layer of the second conductivity type, including, on the front surface side, two regions of the first conductivity type, contacted by metallizations, and a region being formed, by deep diffusion from the front surface, under and in contact with the layer.

5. The structure of claims 1, wherein the first zener diode is formed in a same portion of the substrate as one of the complementary transistors.

6. The structure of claim 5, further including a second zener diode formed in a portion of the substrate distinct from a portion where the second transistor is formed.

7. The structure of claim 5, further including a second zener diode formed in a same portion of the substrate as the second transistor.

8. The structure of claim 1, wherein the two complementary transistors are of bipolar type.

9. The structure of claim 1, wherein the two complementary transistors are of MOS type.

10. A monolithic structure of a zero crossing control circuit of a bidirectional switch including two transistors of complementary types connected in parallel between a gate of the bidirectional switch and a main reference terminal of the bidirectional switch, the gate of the bidirectional switch being connected to a control source, and control terminals of the transistors being connected to a second main terminal of the bidirectional switch via a resistor of high value, a current path of a first zener diode being interposed between the resistor and each of the control terminals according to a biasing constructed and arranged to turn on each of the transistors when the zener threshold is exceeded, wherein the control circuit is formed in a same semiconductor substrate of a first conductivity type as the bidirectional switch.

11. The structure of claim 10, further including a second zener diode wherein each of the control terminals of the transistors is connected to one of the first and second zener diodes, between the resistor and each of the control terminals.

12. The structure of claim 11, wherein the resistor is formed in a same first portion of the substrate as the bidirectional switch.

13. The structure of claim 11, wherein the zener diodes are formed on the front surface side of the substrate in a layer of the second conductivity type, including, on the front surface side, two regions of the first conductivity type, contacted by metallizations, and a region being formed, by deep diffusion from the front surface, under and in contact with the layer.

14. The structure of claims 10, wherein the first zener diode is formed in a same portion of the substrate as one of the complementary transistors.

15. The structure of claim 14, further including a second zener diode formed in a portion of the substrate distinct from a portion where the second transistor is formed.

16. The structure of claim 14, further including a second zener diode formed in a same portion of the substrate as the second transistor.

17. The structure of claim 10, wherein the two complementary transistors are of bipolar type.

18. The structure of claim 10, wherein the two complementary transistors are of MOS type.

* * * * *